US008593176B2

(12) United States Patent
Nijssen et al.

(10) Patent No.: US 8,593,176 B2
(45) Date of Patent: Nov. 26, 2013

(54) ONE PHASE LOGIC

(75) Inventors: Raymond Nijssen, San Jose, CA (US); Kamal Chaudhary, Saratoga, CA (US); Rajit Manohar, Ithaca, NY (US); Christopher LaFrieda, Brooklyn, NY (US); Clinton W. Kelly, San Jose, CA (US); Virantha Ekanayake, San Jose, CA (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/350,342

(22) Filed: Jan. 13, 2012

(65) Prior Publication Data

US 2012/0112792 A1 May 10, 2012

Related U.S. Application Data

(63) Continuation of application No. 13/043,858, filed on Mar. 9, 2011, now Pat. No. 8,106,683, which is a continuation of application No. 12/793,756, filed on Jun. 4, 2010, now Pat. No. 7,932,746.

(51) Int. Cl.
*H03K 19/177* (2006.01)
*H01L 25/00* (2006.01)

(52) U.S. Cl.
USPC .................................. 326/47; 326/93; 326/41

(58) Field of Classification Search
USPC .............. 326/47, 93, 41, 39; 716/103; 377/66
See application file for complete search history.

(56) References Cited

U.S. PATENT DOCUMENTS

| | | | | |
|---|---|---|---|---|
| 5,920,899 | A | 7/1999 | Chu | |
| 6,949,954 | B2 * | 9/2005 | Nystrom et al. | 326/93 |
| 7,584,449 | B2 | 9/2009 | Beerel et al. | |
| 7,913,007 | B2 | 3/2011 | Singh et al. | |
| 7,932,746 | B1 | 4/2011 | Nijssen et al. | |
| 8,106,683 | B2 | 1/2012 | Nijssen et al. | |
| 2003/0233622 | A1 * | 12/2003 | Nystrom et al. | 716/1 |
| 2008/0168407 | A1 | 7/2008 | Manohar | |
| 2010/0005431 | A1 | 1/2010 | Manohar | |
| 2011/0298495 | A1 | 12/2011 | Nijssen et al. | |

FOREIGN PATENT DOCUMENTS

| | | | |
|---|---|---|---|
| JP | 09251058 A * | 9/1997 | |
| WO | WO-2011153333 A1 | 12/2011 | |

OTHER PUBLICATIONS

Hirano, Machine Translation of JP 09251058 A, Sep. 1997.*
"U.S. Appl. No. 12/793,756, Notice of Allowance mailed Dec. 20, 2010", 7 pgs.
"U.S. Appl. No. 13/043,858, Response filed Aug. 25, 2011 to Non Final Office Action mailed May 26, 2011", 10 pgs.
"U.S. Appl. No. 13/043,858, Non Final Office Action mailed May 25, 2011", 6 pgs.
"U.S. Appl. No. 13/043,858, Notice of Allowance mailed Sep. 22, 2011", 8 pgs.
"International Application PCT/US2011/038905, International Search Report mailed Jun. 21, 2011", 4 pgs.
"International Application PCT/US2011/038905, Written Report mailed Jun. 21, 2011", 3 pgs.

* cited by examiner

*Primary Examiner* — Daniel D Chang
(74) *Attorney, Agent, or Firm* — Schwegman Lundberg Woessner P.A.

(57) ABSTRACT

Circuits comprising asynchronous linear pipelines and one-phase pipelines, and methods of forming asynchronous linear pipeline circuits and converting them to one-phase pipeline circuits are provided. Additional circuits, systems and methods are disclosed.

20 Claims, 8 Drawing Sheets

Flow Diagram

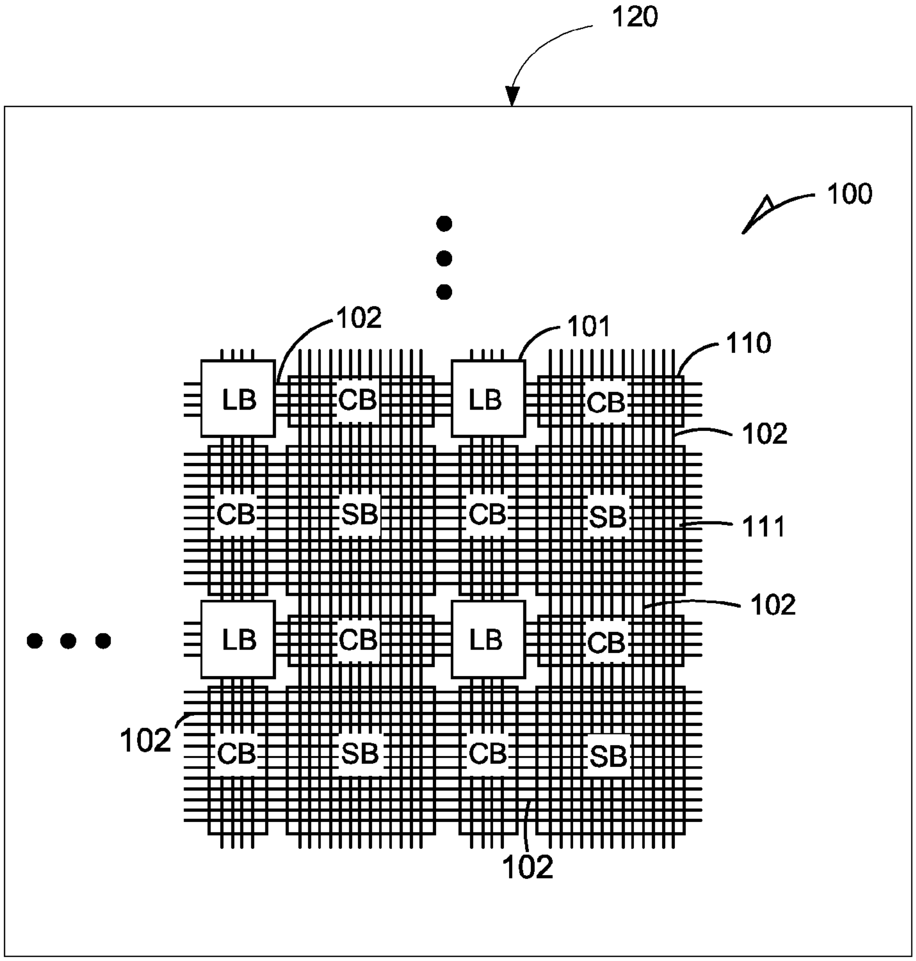
FIG. 1 – Asynchronous Circuit Chip Fabric

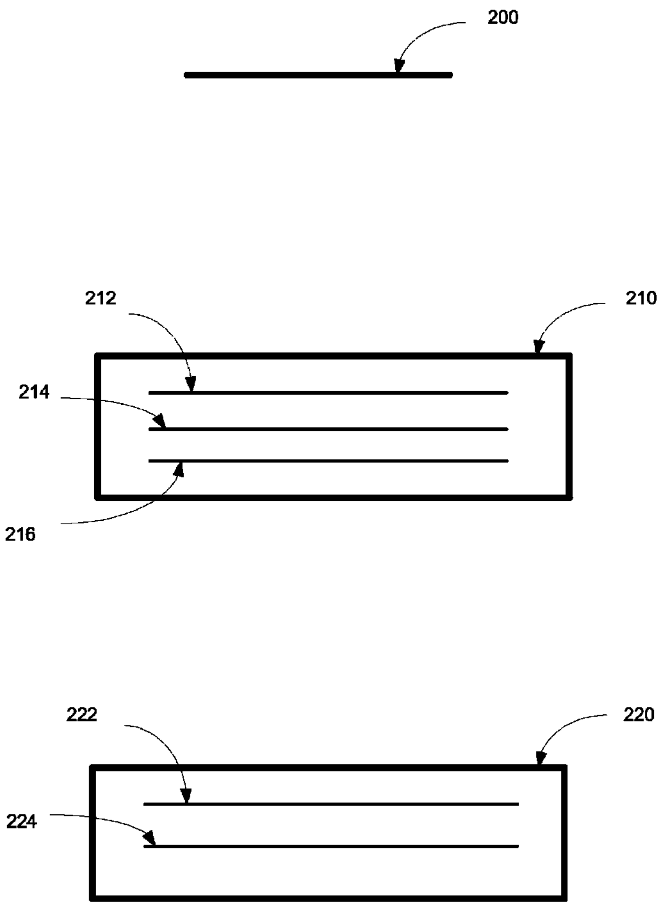
FIG. 2 – Routing Tracks

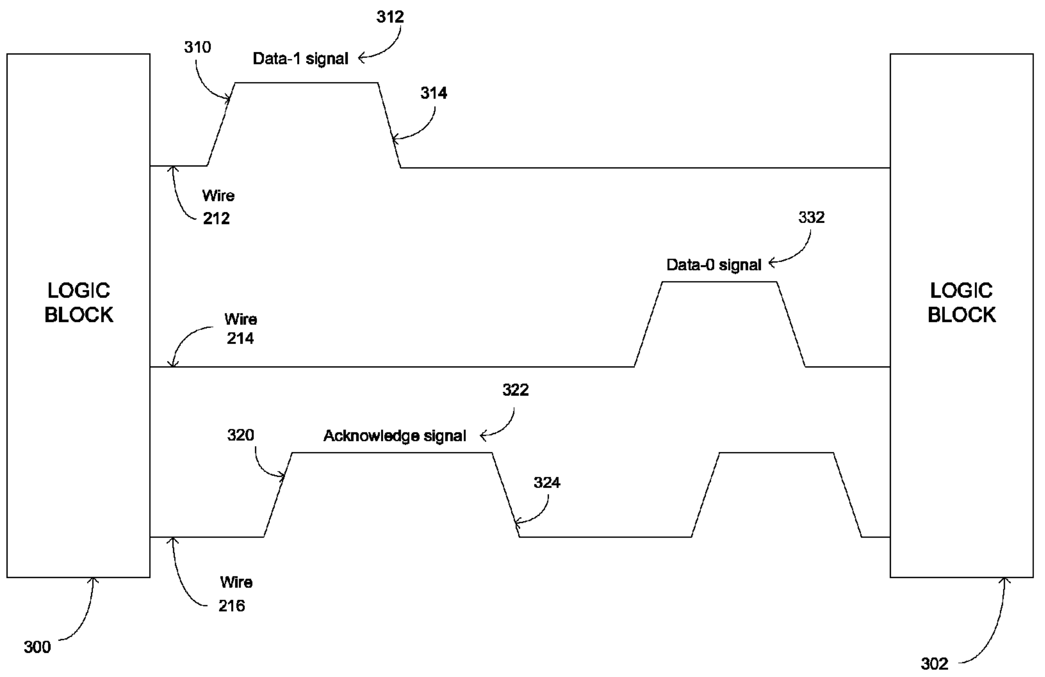
FIG. 3 – Four-Phase Handshake Protocol

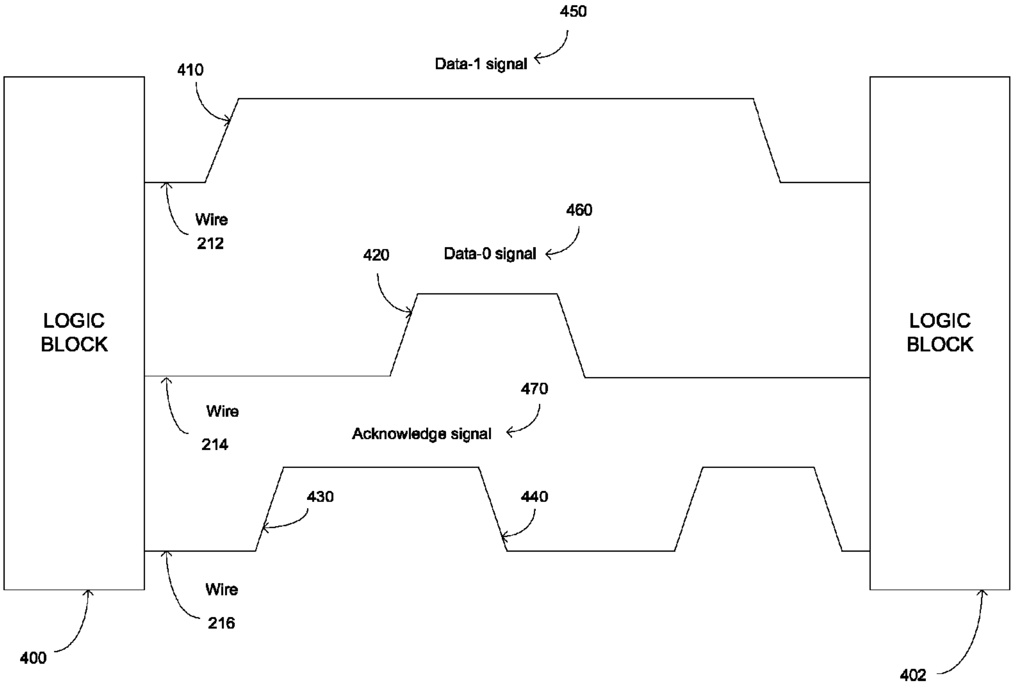
FIG. 4 – Two-Phase Handshake Protocol

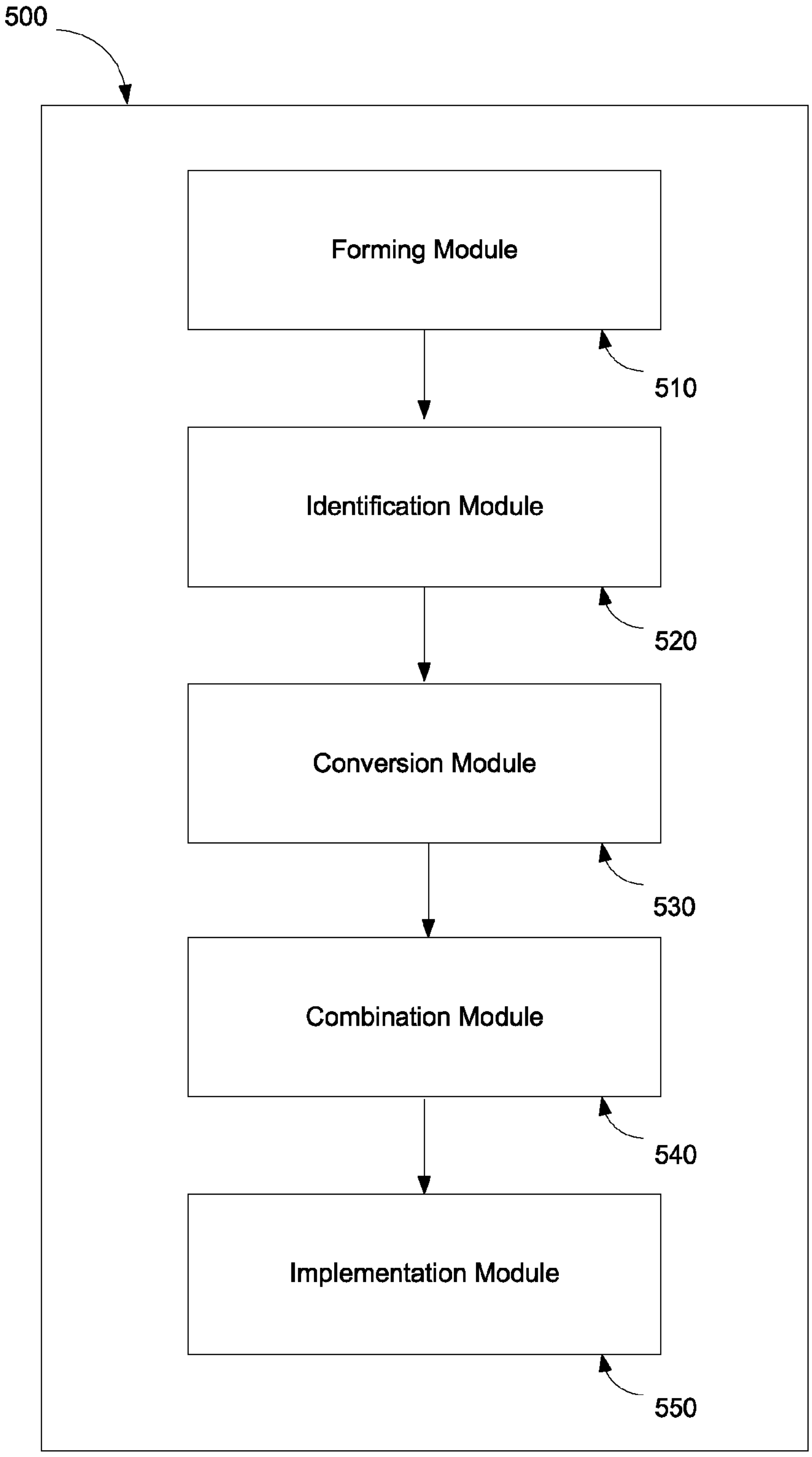
FIG. 5 – System Modules

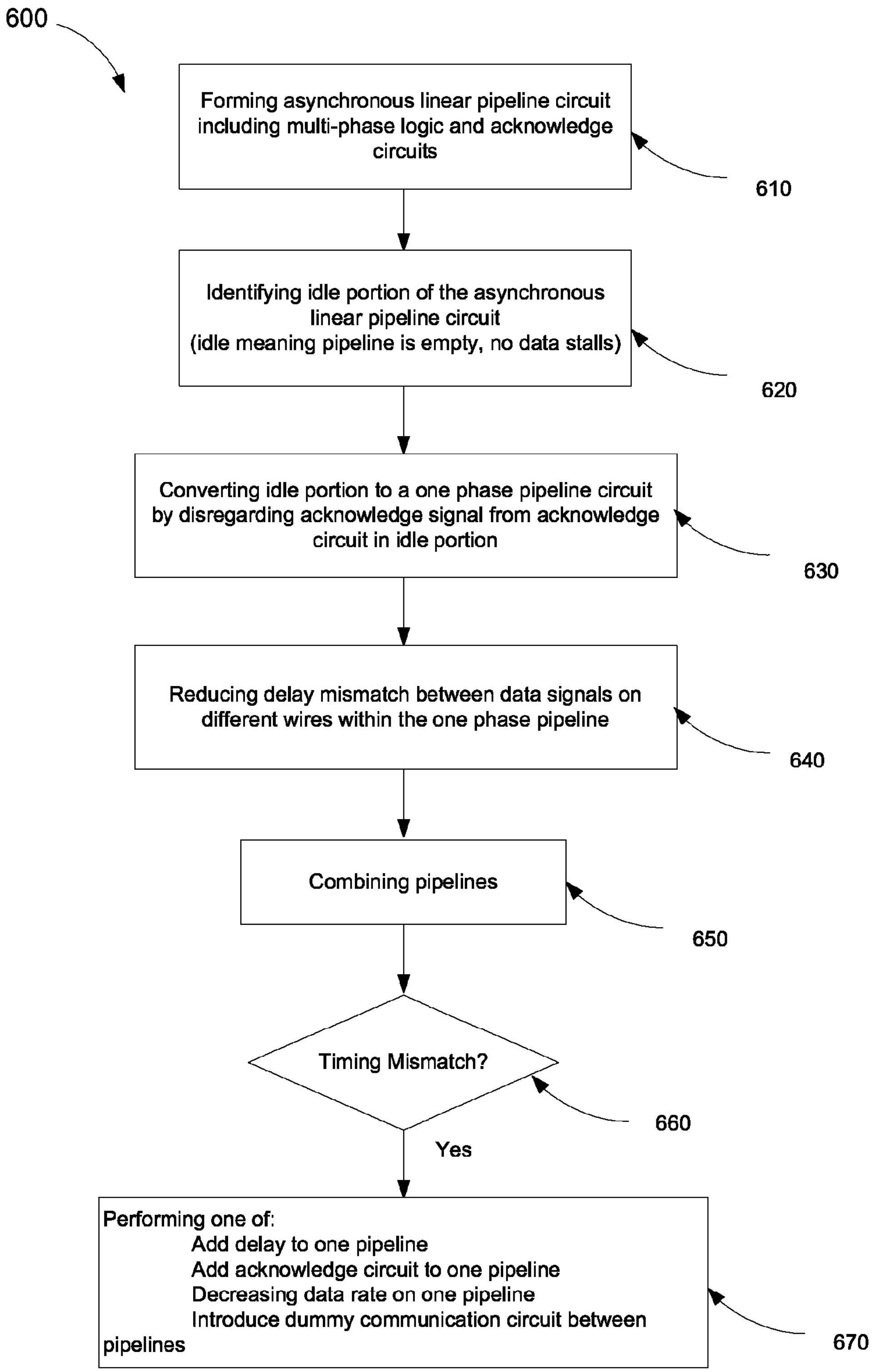
FIG. 6 – Flow Diagram

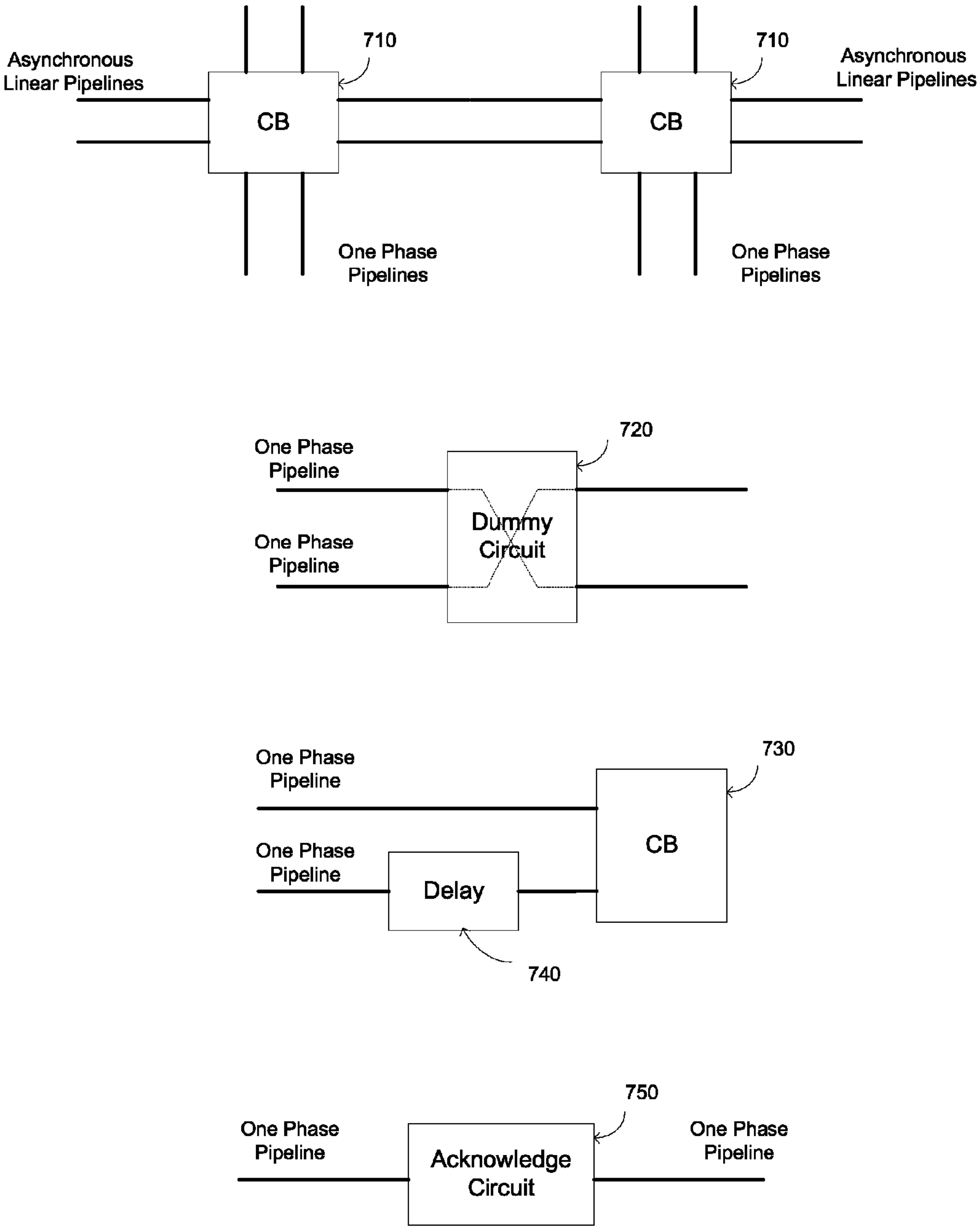
FIG. 7 – Circuit Diagrams

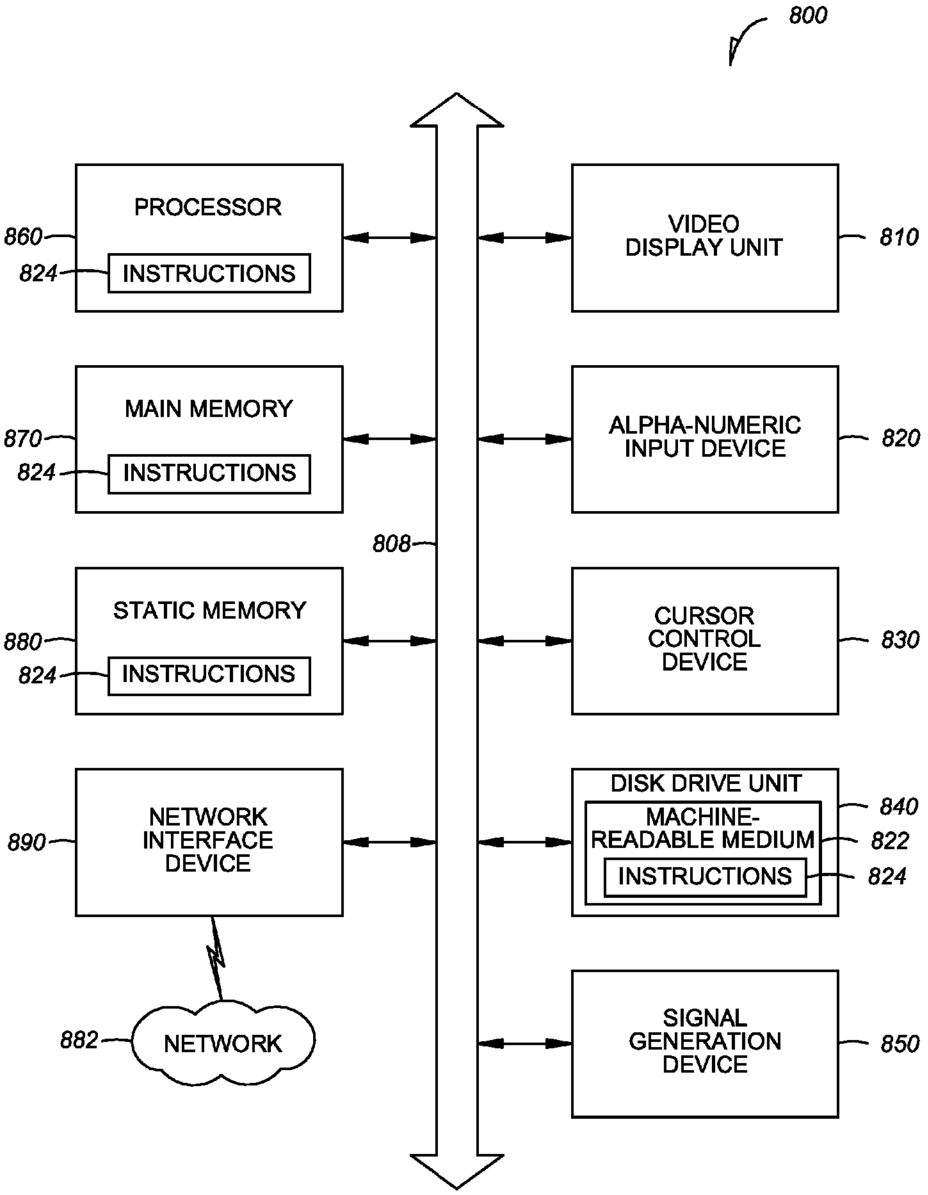
FIG. 8 - System

ONE PHASE LOGIC

This application is a continuation of U.S. patent application Ser. No. 13/043,858, filed on Mar. 9, 2011, now issued as U.S. Pat. No. 8,106,683, which is a continuation of U.S. patent application Ser. No. 12/793,756, filed on Jun. 4, 2010, now issued as U.S. Pat. No. 7,932,746, all of which are incorporated herein by reference in their entireties.

BACKGROUND

Asynchronous digital systems, unlike their synchronous counterparts, often operate without centralized control or a global clock signal to coordinate operations. In some asynchronous systems, operations occur under distributed control, and concurrent modular hardware components with well-defined communication interfaces may communicate and synchronize functions over channels implemented using signaling or handshake protocols on sets of wires.

BRIEF DESCRIPTION OF THE DRAWINGS

Some embodiments of the disclosed technology are illustrated by way of example and not limitation in the figures of the accompanying drawings in which:

FIG. 1 is a diagrammatic view of an example asynchronous circuit chip fabric according to various embodiments of the invention;

FIG. 2 is a diagrammatic view of example routing tracks according to various embodiments of the invention;

FIG. 3 illustrates a four-phase handshake protocol, according to various embodiments of the invention;

FIG. 4 illustrates a two-phase handshake protocol, according to various embodiments of the invention;

FIG. 5 is a system block diagram, according to various embodiments;

FIG. 6 is a flow diagram illustrating methods of operating single phase logic, according to various embodiments of the invention;

FIG. 7 illustrates single phase logic circuit elements, according to various embodiments of the invention; and FIG. 8 is a system block diagram, including an article of manufacture, according to various embodiments of the invention.

DETAILED DESCRIPTION

Example methods, systems and circuits for providing asynchronous one-phase logic operation, including a pipeline, will now be described. In the following description, numerous examples having example-specific details are set forth to provide an understanding of example embodiments. It will be evident, however, to one of ordinary skill in the art that these examples may be practiced without these example-specific details, and/or with different combinations of the details than are given here. Thus, specific embodiments are given for the purpose of simplified explanation, and not limitation.

Asynchronous circuits have a number of advantages compared to their synchronous counterparts when it comes to area, power, and performance. There are a number of different circuit families that can be used to implement asynchronous logic. Embodiments are disclosed pertaining to a family of circuits for asynchronous logic that can improve the performance and reduce the power and area consumption for the implementation of asynchronous logic. This family may also be useful for implementation in a reconfigurable fabric.

Since there is no clock signal used to coordinate data communications in asynchronous logic systems, communication channels are implemented using signaling or handshake protocols on sets of wires.

FIG. 1 is a diagrammatic view of an example asynchronous circuit chip fabric 100 according to various embodiments of the invention. The fabric 100 contains programmable arrays of logic blocks (LB) 101 that support a variety of programmable logic functions. Routing tracks 102 in the fabric 100, illustrated as a plurality of orthogonally oriented tracks, are used to carry electronic signals and implement reconfigurable interconnections between the logic blocks 101. The major elements of a flexible routing architecture used to interconnect the routing tracks and configure the logic blocks include connection boxes (CB) 110 and switch boxes (SB) 111.

In implementation, the switch boxes 111 can be switches that connect wires to wires, e.g. the wires in the horizontal and vertical routing tracks: wires in horizontal tracks to wires in horizontal tracks, wires in vertical tracks to wires in vertical tracks, and wires in horizontal tracks to wires in vertical tracks. The connection boxes 110 can be switches that connect wires in horizontal and/or vertical tracks to the logic block 101 elements. For purposes of illustration, only exemplary elements in the drawing figure have been marked. However, a person of ordinary skill in the art will understand that the routing tracks 102, the connection boxes 110, and the switch boxes 111 can in practice be replicated over the surface of a semiconductor chip in order to provide the desired interconnection functionality.

The structure of the connection boxes 110 and the switch boxes 111 determine the connections of the routing tracks 102 to the logic blocks 101, thereby determining the functionality of the semiconductor chip 120 that includes them. For example, a semiconductor chip 120 that includes the fabric 100 may be fabricated as an FPGA (Field-Programmable Gate Array), such as the type available from Achronix™, Xilinx™, Altera™ and other vendors.

FIG. 2 is a diagrammatic view of example routing tracks 200, 210, 220 according to various embodiments of the invention. In a synchronous fabric, the routing tracks 102 may comprise a single wire 200. In an asynchronous dataflow fabric, each routing track 102 may be implemented using a bundle of wires, each providing a dataflow communication channel. Views 210 and 220 show two different methods of implementing a dataflow interconnect. The routing track 102 could be implemented in a three-wire configuration comprising wires 212, 214, and 216 as shown in view 210, or in a two-wire configuration comprising wires 222 and 224, as shown in view 220. A wire configuration may be selected based upon the type of handshake protocol implemented, including the various types described herein. In many embodiments, including in a gate array semiconductor chip (see chip 120 of FIG. 1), the wires can be contained in what are known as routing tracks comprising groups of 2 or 3 wires per routing track, as shown in views 210 and 220.

In the three-wire configuration of view 210, wires 212 and 214 can be used to send data (for example, using wire 212 for a data-0 signal and wire 214 for a data-1 signal), while wire 216 can be used for a control signal, for example an acknowledge signal. In the two-wire configuration of view 220, also known as a "single track," each of the wires 222 and 224 can be used for either data or control signals. Routing track 102 can thus be used to implement a wide variety of asynchronous communication protocols. These include multi-phase handshake protocols, such as the two-phase and four-phase handshake protocols described below, which can use different bit widths for communication between circuit elements.

FIG. 3 illustrates a four-phase handshake protocol, according to various embodiments of the invention. This communication protocol may be used for asynchronous communication, as follows. As shown, to send data, the protocol uses three wires 212, 214, 216 to carry respectively a data-1 signal 312, a data-0 signal 332, and an acknowledge signal 322. The labels "data-1" and "data-0" are used to indicate and distinguish two separate data signals that are being transmitted in this example. A sequence of signal transitions may be used to send data from logic block 300 to logic block 302. First, the logic block 300 sets wire 212 to a logic high state 310 to transmit the data-1 signal 312. Next, the logic block 302 detects this change, receives the data-1 signal, and then responds by setting wire 216 to a logic high state 320 to transmit the acknowledge signal 322. At this point logic block 300 knows that logic block 302 has successfully received the data-1 signal 312. Logic block 300 now may reset wire 212 to a logic low state 314. In response, the logic block 312 resets wire 216 to a logic low state 324. These four phases occur in sequence to transmit one bit of information, and hence this sequence is referred to as a four-phase handshake protocol. A similar procedure may be followed for transmitting the data-0 signal 332 on wire 214. This protocol may be implemented in a variety of ways, such as using reverse logic level values, discussion of which is not provided here in the interest of brevity.

FIG. 4 illustrates a two-phase handshake protocol, according to various embodiments of the invention. The two-phase handshake protocol reduces the number of communication phases from that described previously. It is similar to the four-phase handshake of FIG. 3, except that the third and fourth phases (the reset of the wires carrying the data and acknowledge signals) are eliminated. The logic states on the wires are simply toggled rather than being set and reset. For example, logic block 400 toggles at time 410 wire 212 to transmit the data-1 signal 450. Logic block 402 responds by toggling at time 430 wire 216 to transmit the acknowledge signal 470 to indicate that the data has been received. The same procedure may be followed for transmitting the data-0 signal 460 by toggling at time 420 wire 214 followed by an acknowledge signal toggle at time 440.

Alternate data representations may also be possible for the data-1 and data-0 signals. For example, the well-known level-encoded-data-representation (LEDR) uses one wire (e.g., the wire 212 of FIG. 4) to represent the data ("D"), and a second wire (e.g., the wire 214 of FIG. 4) to represent a repeat action ("R"). Again, data may be sent by toggling one of the two wires, D or R, with a transition on D signifying a change from the previously sent value, and a transition on R signifying the same data as the previously sent value.

In some embodiments, a further simplification of the communication protocol between sender and receiver is provided. These embodiments may be applicable regardless of the data representation used.

FIG. 5 is a system block diagram, according to various embodiments of the invention. The system module 500 may comprise hardware modules, software modules, and combinations of these as individual modules 510, 520, 530, 540, and 550. Software modules may be implemented by the processor 860 in the system diagram of FIG. 8 according to various embodiments, for example. In some cases, the individual modules 510, 520, 530, 540, and 550 are combined into a single module, or into some number of modules less than their individual number might otherwise indicate.

The forming module 510 forms an asynchronous linear pipeline circuit, including multi-phase logic, and an acknowledge circuit. The identification module 520 identifies the idle portion of the asynchronous linear pipeline circuit that includes a portion of the multi-phase logic. Idle may mean that when data arrives at the input to the pipeline, the pipeline is empty and therefore the data will flow through the pipeline without being stalled. The conversion module 530 converts the idle portion to a one-phase pipeline circuit. The combining module 540 combines data signals from multiple one phase pipeline circuits into a one phase pipeline. The implementation module 550 implements the one phase pipeline in a circuit, such as an FPGA or in a custom implementation as an application-specific integrated circuit (ASIC).

FIG. 6 is a flow diagram illustrating methods of operating single phase logic, according to various embodiments of the invention. The method, 600 is the one by which the system modules of FIG. 5 may operate. At operation 610, an asynchronous linear pipeline circuit including multi-phase logic and acknowledge circuits may be formed by the forming module 510. The circuit formed in this manner may incorporate some or all of the elements described with respect to FIGS. 1-4. The pipeline circuit may use a four-phase handshake protocol to operate as a four-phase pipeline circuit, or it may use a two-phase handshake protocol to operate as a two-phase pipeline circuit. The pipeline circuit may even be formed to accommodate both two and four-phase operations.

At operation 620, at least one idle portion of the asynchronous linear pipeline is identified by the identification module 520. Consider the case when the pipeline itself may be mostly idle because it is not used often in the overall system. In such a scenario, when a data value arrives at the input to the pipeline, the rest of the pipeline is typically empty. This means that the data value will flow through the pipeline without being stalled until it reaches the end of the pipeline. Because the data flows through the pipeline without waiting at any pipeline stage, the acknowledge signals used to regulate the flow of data through the pipeline may be superfluous.

More specifically, in various embodiments of the asynchronous pipeline, data may only move forward when the next stage in the pipeline is ready to accept new data as signaled by the acknowledge signal. In the case when the pipeline is empty, this condition should always be true. That is, the next stage in the pipeline should always be ready to accept new data. Since this condition may be known at design time, the acknowledge signal can be eliminated from the circuit. As a result, communication can be conducted using one phase, rather than two phases. Thus, at operation 630, the identified idle portion is converted to a one-phase pipeline circuit by disregarding the acknowledge signal in the acknowledge circuit with respect to the idle portion of the pipeline. This conversion of the pipeline circuit is performed by the conversion module 530.

At operation 640, the delay mismatch between data signals on different wires within the one phase pipeline are reduced. This is done to reduce the chance of two consecutive data values overtaking one another. For example, if a data-0 signal is sent on one wire followed by a data-1 signal on an adjacent wire, and the delays on the wires are different, then it is possible for the receiver to receive the data-1 signal before the data-0 signal. This would be an error. To avoid this problem, it is useful to balance the delays between the wires that carry the various data signals that comprise a given data transmission. The degree of mismatch in delay will limit the rate at which data can be transmitted over the communication link.

In some situations it may not be possible to eliminate portions of the acknowledge circuitry. A common example is the case where two different pipelines meet, and values from both pipelines are combined together as in the operation 650, performed by the combination module 540. In this case, the output from one pipeline may wait for the output from another pipeline, using acknowledge circuitry to make up for timing differences.

Operation 660 determines if there is a timing mismatch between pipelines. If this is the case, one of several actions can be performed in operation 670, including the addition of delay to one of the pipelines to substantially match pipelines delays associated with each of the one-phase pipeline circuits, adding an acknowledge circuit to one of the pipelines to accommodate a potential stall condition in the first or second one phase pipeline circuit, decreasing the data rate on one of the pipelines, and/or introducing a dummy communication circuit between the pipelines. A dummy communication is a crossover path that serves to switch data from the slow pipeline to the fast pipeline.

FIG. 7 illustrates single phase logic circuit elements, according to various embodiments of the invention. At connection block 710 an asynchronous linear pipeline and a one phase pipeline are combined. A dummy circuit 720 is used to combine two one phase pipelines. A connection block 730 is used to combine two one phase pipelines with a delay 740 inserted in one of the pipelines. An acknowledged circuit 750 is used to combine two one phase pipelines.

Any location in the circuit where data may have to wait should include the appropriate acknowledge circuitry. If a significant stall on part of a pipeline is possible, then there should be a sufficient number of asynchronous pipeline stages that have acknowledge circuitry to accommodate all the data that may be stalled. Additional pipeline stages may be introduced to handle this scenario by determining the maximum number of data values that could be stalled at a particular location in the system. The number of pipeline stages with acknowledge circuitry depends on how the pipeline stage is implemented, e.g., half-buffering stages or full-buffering stages. Two half-buffering stages may be required to store a data value, as compared to only one full-buffering stage. Therefore, in the case of half-buffering asynchronous pipelines, the number of pipeline stages with acknowledge circuitry is at least twice the anticipated maximum number of stalled data values. In the case of full-buffering asynchronous pipelines, the number of pipeline stages with acknowledge circuitry is at least the anticipated maximum number of stalled data values.

Another method to mitigate the possibility that many data values are waiting at the junction of two pipelines is to decrease the rate at which data is inserted into the faster pipeline. This should reduce the throughput of the faster pipeline, thereby reducing the gap in the delay of two different pipelines and hence the number of waiting data values. For example, the throughput can be reduced by an amount determined by comparing the overall timing behavior of the complete system to the timing behavior of the fast pipeline segment.

Additionally, the design itself may be modified to decrease the number of waiting data values. This may be done by the introduction of dummy communications between slower and faster pipelines whose sole purpose is to balance the delays between two pipelines that meet at a common location.

There are a number of ways to create an interface between two-phase and one-phase logic. The most direct interface creation method may be to simplify the two-phase receiver and transmitter circuits by eliminating the acknowledge signals. In the transmitter case, the acknowledge signal is assumed to always be ready and the transmitter can be simplified using this assumption, by eliminating circuitry to receive the acknowledge signal. Similarly, the normal two-phase receiver generates an acknowledge signal, but since it is ignored in a one-phase logic system, all the associated circuitry used to generate that acknowledge signal may be eliminated. A similar approach can be used to create an interface between four-phase logic and one-phase logic.

To mitigate delay mismatch between the transmitter and its receiver, the transmitter data rate may be lowered to ensure that data values are sent with a sufficient delay interval so that a delay mismatch should not cause an error. Note that once the data has arrived at a location that contains acknowledge circuitry, this is no longer a concern. Hence it is important that the data eventually be processed by a circuit that contains acknowledge circuitry. To provide reliable operation, any loop in the pipeline should contain at least two adjacent circuits that have a two-phase or four-phase handshake protocol with acknowledge signals. A loop in the pipeline exists when the output of a logic block is fed back to an input of the same logic block.

Various embodiments include a number of extensions to this approach. Different two-phase, four-phase, or any other delay insensitive communication may be converted to their corresponding one-phase counterparts. For example, instead of using a dual rail (one-of-two) code with two signal wires as previously described, one could use a one-of-N code where one of N possible signals are transmitted using one of N available wires plus the acknowledge. Four phase and two phase one-of-N codes work in the same manner as one-of-two codes. In the four phase case, the selected signal wire is set, then the acknowledge wire is set, then the signal wire is reset and finally the acknowledge wire is reset. In the two phase case, the wires are toggled as previously explained. Likewise, the conversion of four phase or two phase one-of-N codes to their one phase counterparts is performed in the same manner as previously described, involving the elimination of the acknowledge signal when the pipeline is determined to be idle.

Other delay insensitive codes exist which allow for the transmission of more than one signal over N wires. These codes include Sperner codes and Berger codes, among others, and are well-known to persons of ordinary skill in the art. These delay insensitive codes all share the common characteristic that, although multiple signals are transmitted over the N wires with varying delays, the receiver can determine when the final signal has arrived, based on the codeword formed by the combination of the received N signals. Once the receiver has made this determination it can send the acknowledge signal back to the transmitter.

These multi-signal codes are implemented using four phase or two-phase handshake protocols in the same manner as the one-of-N codes previously described. Likewise, they can be converted to their one phase counterparts by the elimination of the acknowledge signal when the pipeline is determined to be idle.

One-phase logic may also be combined with existing two-phase or four-phase logic. Hybrid approaches where some data bits are one-phase, but others use conventional signaling logic are also possible.

One-phase logic may be utilized to improve the design of the routing architecture in the asynchronous FPGA. In particular, all the components of the switch box, logic block, and connection box may be implemented using one-phase logic instead of two-phase or four-phase logic as performed by the implementation module 550. This approach can significantly reduce the area, delay, and power of the overall asynchronous FPGA.

When multiple pipelines meet at a computation block, each input to the logic could use different communication protocols. For example, consider the case of a two-input AND function with input "A" and "B," where it is known that input "B" always arrives before input "A." The two inputs are connected to two different senders, SA (sending data that arrives on input A) and SB (sending data that arrives on input B). The implementation may be optimized so that SB only sends data if the new data value differs from the previous value transmitted. The evaluation of the AND function is triggered by the arrival of input A, and at this point the correct data value may be inferred for input B. This optimization is also useful in the context of an FPGA implementation, because there may be some signals that rarely change. These slow-changing signals may be optimized using this approach.

Embodiments may include a circuit comprising: a plurality of asynchronous linear pipeline circuits including multi-phase logic and acknowledge circuits; a plurality of one-phase pipeline circuits that operate to disregard acknowledge signals in idle portions of the plurality of asynchronous linear pipeline circuits; and a plurality of connection blocks to provide a set of connections between a selected number of the plurality of asynchronous linear pipeline circuits and the plurality of one-phase pipeline circuits.

Further embodiments may include a connection between a first one-phase pipeline circuit and a second one-phase pipeline circuit formed by a dummy circuit disposed between the first one-phase pipeline circuit and the second one-phase pipeline circuit.

Still further embodiments may include a connection between a first one-phase pipeline circuit and a second one-phase pipeline circuit formed by a delay element in the first one-phase pipeline circuit.

Still further embodiments may include a connection between a first one-phase pipeline circuit and a second one-phase pipeline circuit formed by an acknowledge circuit in the first one-phase pipeline circuit.

Still further embodiments may include the asynchronous linear pipeline circuits, and the one-phase pipeline circuits being implemented in an FPGA.

FIG. 8 is a system 800 block diagram, including an article of manufacture, according to various embodiments. The system 800 may comprise a set of instructions that can be executed to cause the system 800 to perform any one or more of the methodologies discussed herein. In alternative embodiments, the system 800 may operate as a standalone device or may be connected (e.g., via a network) to other systems. In a networked deployment, the system 800 may operate in the capacity of a server or a client system in a server-client network environment or as a peer system in a peer-to-peer (or distributed) network environment. System 800 may be realized as a specific machine in the form of a computer.

The system (800) may be a computer aided design (CAD) workstation that operates to create the programming for the FPGA.

The system 800 may be a server computer, a client computer, a personal computer (PC), a tablet PC, or any system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

The example system 800 may include the processor 860 (e.g., a central processing unit (CPU), a graphics processing unit (GPU) or both), a main memory 870 and a static memory 880, all of which communicate with each other via a bus 808. The system 800 may further include a video display unit 810 (e.g., a liquid crystal display (LCD) or cathode ray tube (CRT)). The system 800 also may include an alphanumeric input device 820 (e.g., a keyboard), a cursor control device 830 (e.g., a mouse), a disk drive unit 840, a signal generation device 850 (e.g., a speaker), and a network interface device 890.

The disk drive unit 840 may include a machine-readable medium 822 on which may be stored one or more sets of instructions (e.g., software) 824 embodying any one or more of the methodologies or functions described herein. The instructions 824 may also reside, completely or at least partially, within the main memory 870 and/or within the processor 860 during execution thereof by the system 800, with the main memory 870 and the processor 860 also constituting machine-readable media. The instructions 824 may further be transmitted or received over a network 882 via the network interface device 890.

While the machine-readable medium 822 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium capable of storing, encoding, or carrying a set of instructions for execution by the machine and that cause the machine to perform any one or more of the methodologies of the present technology. The term "machine-readable medium" shall accordingly be taken to include, but not be limited to tangible media, including solid-state memories and optical and magnetic media.

The system (800) may implement one or more modules, the modules comprising: a forming module to form an asynchronous linear pipeline circuit including multi-phase logic and acknowledge circuits; an identification module to identify at least one idle portion of the asynchronous linear pipeline circuit that includes a portion of the multi-phase logic; and a conversion module to convert the identified at least one idle portion of the asynchronous linear pipeline circuit to a one-phase pipeline circuit.

The conversion module may further operate to disregard acknowledge signals from acknowledge circuits, corresponding to the idle portion.

The conversion module may still further operate to reduce delay mismatches, corresponding to the plurality of data signals on the plurality of wires in the one phase pipeline.

Embodiments of asynchronous one-phase pipeline circuits, and methods of forming them, have been described. Implementing such circuits may result in reduced power consumption, reduced die area, and increased processing speed. Although several specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:

receiving a circuit design for an asynchronous linear pipeline circuit including multi-phase logic and acknowledge circuits; and converting at least one idle portion of the asynchronous linear pipeline circuit that includes a portion of the multi-phase logic to a one-phase pipeline circuit.

2. The method of claim 1, further comprising identifying the at least one idle portion of the asynchronous linear pipeline circuit that includes the portion of the multi-phase logic.

3. The method of claim 2, wherein identifying the at least one idle portion of the asynchronous linear pipeline circuit comprises identifying an empty portion of the asynchronous linear pipeline circuit.

4. The method of claim 1, wherein the converting the at least one idle portion of the asynchronous linear pipeline circuit to the one-phase pipeline circuit further comprises disregarding acknowledge signals from acknowledge circuits corresponding to the at least one idle portion.

5. The method of claim 1, wherein the one-phase pipeline circuit further comprises a plurality of data signals on a plurality of wires, and wherein the converting the at least one idle portion of the asynchronous linear pipeline circuit to the one-phase pipeline circuit further comprises reducing delay mismatches corresponding to the data signals.

6. The method of claim 1, further comprising combining a first set of data signals from a first one-phase pipeline circuit with a second set of data signals from a second one-phase pipeline circuit.

7. The method of claim 6, further comprising adding a delay to one of the first one-phase pipeline circuit or the second one-phase pipeline circuit to substantially match pipeline delays associated with each of the first and second one-phase pipeline circuits.

8. The method of claim 6, further comprising adding an acknowledge circuit to one of the first one-phase pipeline circuit or the second one-phase pipeline circuit to accommodate a potential stall condition in the first one-phase pipeline circuit or the second one-phase pipeline circuit.

9. The method of claim 6, further comprising:

decreasing a first data rate associated with the first one-phase pipeline circuit to match a second data rate associated with the second one-phase pipeline circuit when the first data rate is higher than the second data rate.

10. The method of claim 6, further comprising:

introducing a dummy communication circuit between the first one-phase pipeline circuit and the second one-phase pipeline circuit to balance a delay when data rates between the first and second one-phase pipeline circuits are not matched.

11. A circuit comprising:

a plurality of asynchronous linear pipeline circuits including multi-phase logic and acknowledge circuits; and a plurality of connection blocks to provide a set of connections between a selected number of the plurality of asynchronous linear pipeline circuits and a plurality of one-phase pipeline circuits, the one-phase pipeline circuits operable to disregard acknowledge signals in idle portions of the plurality of asynchronous linear pipeline circuits.

12. The circuit of claim 11, wherein the plurality of one-phase pipeline circuits comprises a first and a second one-phase pipeline circuit, and wherein a connection between the first one-phase pipeline circuit and the second one-phase pipeline circuit is formed by a dummy circuit disposed between the first one-phase pipeline circuit and the second one-phase pipeline circuit.

13. The circuit of claim 11, wherein a connection between a first one-phase pipeline circuit included in the plurality of one-phase pipeline circuits and a second one-phase pipeline circuit in the plurality of one-phase pipeline circuits comprises a delay element in the first one-phase pipeline circuit.

14. The circuit of claim 11, wherein a connection between a first one-phase pipeline circuit included in the plurality of one-phase pipeline circuits and a second one-phase pipeline circuit included in the plurality of one-phase pipeline circuits is formed by an acknowledge circuit in the first one-phase pipeline circuit.

15. A system comprising:

one or more processors coupled to a memory to implement one or more modules, the one or more modules comprising:

a forming module to form an asynchronous linear pipeline circuit including multi-phase logic and acknowledge circuits from received circuit design information; and a conversion module to convert at least one idle portion of the asynchronous linear pipeline circuit that includes a portion of the multi-phase logic to a one-phase pipeline circuit.

16. The system of claim 15, wherein the one or more modules further comprises an identification module to identify the at least one idle portion of the asynchronous linear pipeline circuit.

17. The system of claim 15, wherein the conversion module is to disregard acknowledge signals from acknowledge circuits corresponding to the idle portion.

18. The system of claim 15, wherein the one-phase pipeline circuit further comprises a plurality of wires to transmit a plurality of data signals, and wherein the conversion module is to reduce delay mismatches associated with the data signals.

19. A non-transitory machine-readable storage medium containing instructions that when executed by a machine, cause the machine to perform a method comprising:

forming an asynchronous linear pipeline circuit including multi-phase logic and acknowledge circuits from a received circuit design; and converting at least one idle portion of the asynchronous linear pipeline circuit that includes a portion of the multi-phase logic to a one-phase pipeline circuit.

20. The non-transitory machine-readable storage medium of claim 19, wherein the method performed by the machine further comprises:

identifying the at least one idle portion of the asynchronous linear pipeline.

* * * * *

UNITED STATES PATENT AND TRADEMARK OFFICE

CERTIFICATE OF CORRECTION

PATENT NO. : 8,593,176 B2
APPLICATION NO. : 13/350342
DATED : November 26, 2013
INVENTOR(S) : Nijssen et al.

It is certified that error appears in the above-identified patent and that said Letters Patent is hereby corrected as shown below:

On the Title Page, item (56)

In column 2, under "Other Publications", line 6, delete "25," and insert --26,--, therefor In column 2, under "Other Publications", line 10, after "Application", insert --Serial No.--, therefor In column 2, under "Other Publications", line 12, after "Application", insert --Serial No.--, therefor In the Specification In column 2, line 7, before "fabric", insert --circuit chip--, therefor In column 2, line 9, before "fabric", insert --circuit chip--, therefor In column 2, line 34, before "fabric", insert --circuit chip--, therefor In column 3, line 18, delete "312" and insert --302--, therefor Signed and Sealed this
Seventeenth Day of June, 2014

Michelle K. Lee

Michelle K. Lee
*Deputy Director of the United States Patent and Trademark Office*